United States Patent
Lim et al.

(10) Patent No.: US 10,033,412 B2
(45) Date of Patent: Jul. 24, 2018

(54) IMPEDANCE AND SWING CONTROL FOR VOLTAGE-MODE DRIVER

(71) Applicant: Xilinx, Inc., San Jose, CA (US)

(72) Inventors: Siok Wei Lim, Singapore (SG); Kok Lim Chan, Singapore (SG); Kee Hian Tan, Singapore (SG); Hongyuan Zhao, Singapore (SG); Chin Yang Koay, Singapore (SG); Yohan Frans, Palo Alto, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/837,791

(22) Filed: Dec. 11, 2017

(65) Prior Publication Data

US 2018/0102797 A1   Apr. 12, 2018

Related U.S. Application Data

(62) Division of application No. 15/227,853, filed on Aug. 3, 2016, now Pat. No. 9,887,710.

(51) Int. Cl.
*H03K 17/687* (2006.01)
*H04B 1/04* (2006.01)
*H03M 9/00* (2006.01)
*H02M 3/158* (2006.01)

(52) U.S. Cl.
CPC .............. *H04B 1/04* (2013.01); *H02M 3/158* (2013.01); *H03K 17/6872* (2013.01); *H03M 9/00* (2013.01)

(58) Field of Classification Search
CPC .......... H04B 1/04; H02M 3/158; H03M 9/00; H03K 17/6872
See application file for complete search history.

(56) References Cited

U.S. PATENT DOCUMENTS

| | | |
|---|---|---|
| 8,446,173 B1 | 5/2013 | Faucher et al. |
| 8,493,103 B2 | 7/2013 | Fukuda et al. |
| 8,520,348 B2 | 8/2013 | Dong |

(Continued)

OTHER PUBLICATIONS

Specification and drawings for U.S. Appl. No. 15/227,853, filed Aug. 3, 2016, Lim et al.

(Continued)

*Primary Examiner* — Vineeta Panwalkar
(74) *Attorney, Agent, or Firm* — Keith Taboada

(57) ABSTRACT

A driver circuit includes a plurality of output circuits coupled in parallel between a differential input and a differential output and having a first common node and a second common node. Each of the plurality of output circuits includes a series combination of a pair of inverters and a pair of resistors, coupled between the differential input and the differential output; first source terminals of the pair of inverters coupled to the first common node; and second source terminals of the pair of inverters coupled to the second common node. The driver circuit further includes a first voltage regulator having an output coupled to the first common node of the plurality of output circuits; a second voltage regulator having an output coupled to the second common node of the plurality of circuits; and a current compensation circuit coupled between the outputs of the first voltage regulator and the second voltage regulator.

11 Claims, 5 Drawing Sheets

(56) References Cited

U.S. PATENT DOCUMENTS

| | | | |
|---|---|---|---|
| 8,581,628 B2* | 11/2013 | Yeh | G08C 19/00 |
| | | | 326/115 |
| 9,231,631 B1 | 1/2016 | Ke et al. | |
| 2004/0150430 A1 | 8/2004 | Li | |
| 2008/0238521 A1 | 10/2008 | Huang | |
| 2013/0163126 A1 | 6/2013 | Dong | |
| 2013/0343471 A1 | 12/2013 | Suzuki et al. | |

OTHER PUBLICATIONS

Kossel, Marcel et al., "A T-Coil-Enhanced 8.5 Gb/s High-Swing SST Transmitter in 65 nm Bulk CMOS With < −16 dB Return Loss Over 10 GHz Bandwidth," IEEE Journal of Solid-State Circuits, Dec. 2008, pp. 2905-2920, vol. 43, No. 12, IEEE, Piscataway, New Jersey, USA.

Philpott, R. A. et al., "A 20Gb/s SerDes Transmitter with Adjustable Source Impedence and 4-tap Feed-Forward Equalization in 65nm Bulk CMOS," Proc. of the IEEE 2008 Custom Integrated Circuits Conference, Sep. 21, 2008, pp. 623-626, IEEE, Piscataway, New Jersey, USA.

Song, Young-Hoon et al., "A 6-Gbit/s Hybrid Voltage-Mode Transmitter With Current-Mode Equalization in 90-nm CMOS," IEEE Transactions on Circuits and Systems—II: Express Briefs, Aug. 2012, pp. 491-495, vol. 59, No. 8, IEEE, Piscataway, New Jersey, USA.

* cited by examiner

IMPEDANCE AND SWING CONTROL FOR VOLTAGE-MODE DRIVER

CROSS-REFERENCE TO RELATED APPLICATION

This application is a divisional of U.S. patent application Ser. No. 15/227,853 filed on Aug. 3, 2016, which is hereby incorporated herein by reference.

TECHNICAL FIELD

Examples of the present disclosure generally relate to electronic circuits and, in particular, to impedance and swing control for a voltage-mode driver.

BACKGROUND

In serial communication systems, a large percentage of the total power is consumed in the transmitter, which must provide for adequate signal swing on a low-impedance channel while maintaining an appropriate source termination. In addition, the transmitter often includes equalization to compensate for frequency-dependent loss in the channel. The driver circuit in the transmitter often consumes the majority of the power of the transmitter. Driver circuits can be implemented as current-mode drivers or voltage-mode drivers. Voltage-mode drivers are known to consume far less power in comparison to current-mode drivers. For example, a voltage-mode driver can consume four times less DC power than a current-mode driver to provide the same output swing.

A voltage-mode driver for a transmitter requires swing and impedance control such that the swing and common-mode/differential-mode return loss are within specifications. One technique for output signal swing control in a driver circuit is to use a single voltage regulator to generate a reference voltage that sets the voltage swing. However, with a single regulator, the common-mode will shift as the output swing of the driver circuit changes. Such a shift in the common-mode can cause the return loss to exceed specifications.

SUMMARY

Techniques for impedance and swing control for a voltage-mode driver are described. In an example, a driver circuit includes a plurality of output circuits coupled in parallel between a differential input and a differential output and having a first common node and a second common node. Each of the plurality of output circuits includes a series combination of a pair of inverters and a pair of resistors, coupled between the differential input and the differential output; first source terminals of the pair of inverters coupled to the first common node; and second source terminals of the pair of inverters coupled to the second common node. The driver circuit further includes a first voltage regulator having an output coupled to the first common node of the plurality of output circuits; a second voltage regulator having an output coupled to the second common node of the plurality of circuits; and a current compensation circuit coupled between the outputs of the first voltage regulator and the second voltage regulator.

In another example, a driver circuit includes a plurality of output circuits coupled in parallel between a differential input and a differential output and having a first common node and a second common node. Each of the plurality of output circuits includes a series combination of a pair of enable circuits, a pair of inverters, and a pair of resistors, coupled between the differential input and the differential output; a first transistor coupled between the first common node and first source terminals of the pair of inverters; and a second transistor coupled between the second common node and second source terminals of the pair of inverters. The driver circuit further includes first and second replica output circuits coupled in series between the first and second common nodes; and a control circuit coupled to each of: respective gates of the first and second transistors in each of the plurality of output circuits; and the first and second replica output circuits.

In another example, a method of controlling a driver circuit in a transmitter includes receiving a plurality of outputs of an equalizer in the transmitter; coupling each of the plurality of outputs of the equalizer to at least one of a plurality of output circuits of the driver circuit; enabling first and second voltage regulators coupled to the plurality of output circuits; and enabling at least one of a plurality of current compensation circuits coupled between the first and second voltage regulators.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
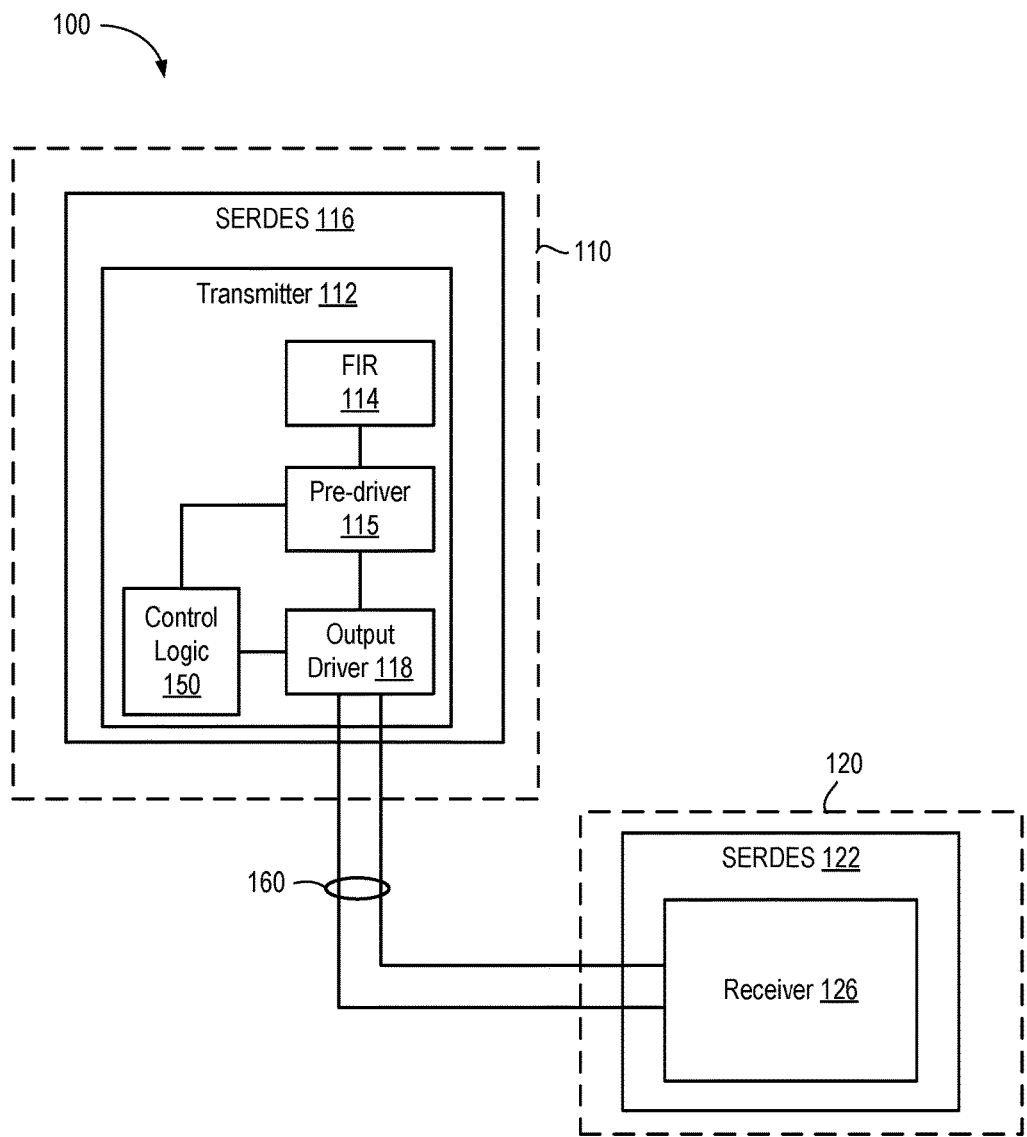
FIG. 1 is a block diagram depicting an example of a serial communication system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for impedance and swing control for a voltage-mode driver are described. In an example, a driver circuit includes output circuits between a differential input and a differential output. The output circuits are coupled between first and second common nodes. Each output circuit includes a pair of inverters and a pair of resistors coupled between the differential input and output. First source terminals of the pair of inverters are coupled to the first common node and second source terminals of the pair of inverters are coupled to the second common node. First and second voltage regulators are coupled to the first and second common nodes. A current compensation circuit is coupled between outputs of the first and second voltage regulators. Zero or more of the current compensation circuits can be selectively enabled to draw dummy current from the voltage regulators to improve return loss, as discussed further below. Further, use of dual regulators allows for a fixed common mode in both low- and high-swing modes. These and further aspects are discussed below with respect to the drawings.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SERDES) 116. The receiver 126 can be part of a SERDES 122. The transmission medium 160 comprises an electrical path between the transmitter 112 and the receiver 126 and can include printed circuit board (PCB) traces, vias, cables, connectors, decoupling capacitors, and the like. In examples, the transmission medium 160 includes a matched pair of transmission lines each having a characteristic impedance ($Z_0$). The receiver of the SERDES 116, and the transmitter of the SERDES 122, are omitted for clarity. In some examples, the SERDES 116 can be disposed in an integrated circuit (IC) 110, and the SERDES 122 can be disposed in an IC 120.

In general, the transmitter 112 generates a serial data signal from a parallel data path (serialization). The serial data signal has a particular data rate (symbol rate). In some examples, data bytes from the parallel data path can be encoded prior to serialization using, for example, and 8B/10B encoder or the like. The transmitter 112 drives the serial data signal onto the transmission medium 160 using a digital modulation technique, such as binary non-return-to-zero (NRZ) pulse amplitude modulation (PAM). The transmission medium 160 propagates electrical signal(s) representing symbols of the serial data signal (e.g., logic "1" and logic "0") towards the receiver 126.

In the example shown, the transmission medium 160 is a differential channel. Data on the differential channel is represented using two electrical signals ("true" and "complement" signals). A logic "0" is represented by driving the true signal to its lower voltage limit and driving the complement signal to its upper voltage limit. A logic "1" is represented by driving the true signal to its upper voltage limit and driving the complement signal to its lower voltage limit. Thus, the logic value of each transmitted symbol is based on the difference between the true and complement signals, and not based on the level of either signal individually. The peak-to-peak difference between the true signal and the complement signal is the voltage swing (also referred to as signal swing or swing).

The transmitter 112 includes a finite impulse response (FIR) filter 114, a pre-driver 115, an output driver 118, and control logic 150. The transmitter 112 is configured to equalize the serial data signal prior to transmission over the transmission medium 160. The FIR 114 can be used to mitigate inter-symbol interference (ISI) caused by the transmission medium 160. The transmission medium 160 degrades the signal quality of the transmitted signal. Channel insertion loss is the frequency-dependent degradation in signal power of the transmitted signal. When signals travel through a transmission line, the high frequency components of the transmitted signal are attenuated more than the low frequency components. In general, channel insertion loss increases as frequency increases. Signal pulse energy in the transmitted signal can be spread from one symbol period to another during propagation on the transmission medium 160. The resulting distortion is known as 151. In general, ISI becomes worse as the speed of the communication system increases.

The output of the FIR filter 114 is coupled to an input of the pre-driver 115. The output of the FIR filter 114 can include a plurality of signals, including a main-cursor signal, and one or more pre-cursor signals, one or more post-cursor signals, or a plurality of post-cursor and pre-cursor signals. For purposes of clarity by example, the present description assumes the FIR filter 114 outputs one main-cursor signal, one pre-cursor signal, and one post-cursor signal. The pre-driver 115 is configured to couple the output of the FIR filter 114 to the output driver 118. As discussed below, the output driver 118 is segmented and includes a plurality of output circuits coupled in parallel to the transmission medium 160. The pre-driver 115 couples each of the main-cursor, the pre-cursor, and the post-cursor signals to a selected percentage of the output circuits of the output driver 118. The percentages of output circuits driven by the main-cursor, pre-cursor, and post-cursor signals as selected by the pre-driver 115 is controlled by the control logic 150. The control logic 150 also controls aspects of the output driver 118, as discussed further below.

While the SERDES 116 and the SERDES 122 are shown, in other examples, each of the transmitter 112 and/or the receiver 126 can be a stand-alone circuit not being part of a larger transceiver circuit. In some examples, the transmitter 112 and the receiver 126 can be part of one or more integrated circuits (ICs), such as application specific integrated circuits (ASICs) or programmable ICs, such as field programmable gate arrays (FPGAs).

Figure 2:
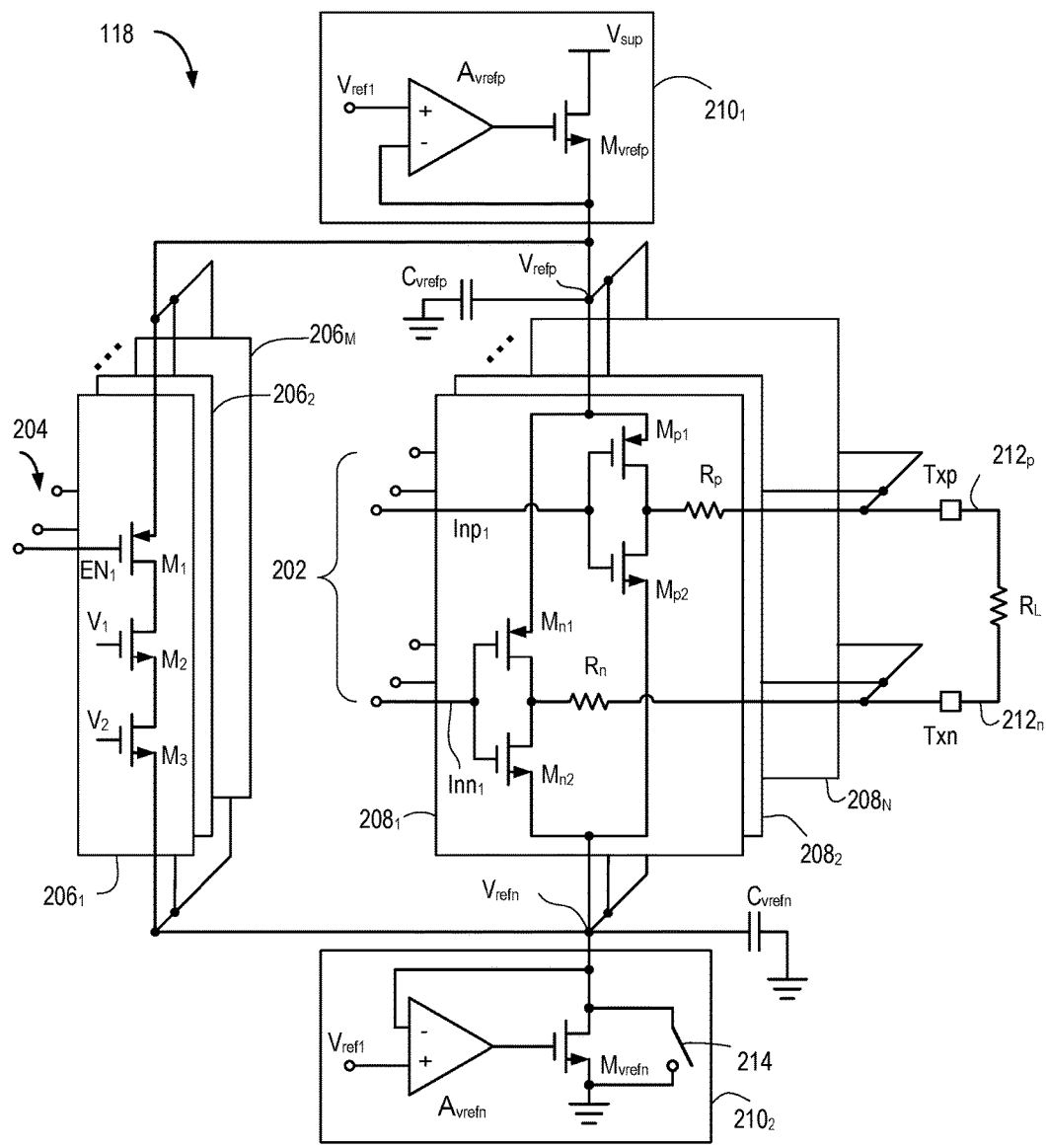
FIG. 2 is a schematic diagram depicting an output driver according to an example.

FIG. 2 is a schematic diagram depicting the output driver 118 according to an example. The output driver 118 includes output circuits $208_1$ through $208_N$ (where N is an integer greater than one), voltage regulators $210_1$ and $210_2$, and current compensation circuits $206_1$ through $206_M$ (where M is an integer greater than one). The output circuits $208_1$ through $208_N$ are collectively referred to as output circuits 208; the voltage regulators $210_1$ and $210_2$ are collectively referred to as voltage regulators 210; and the current compensation circuits $206_1$ through $206_M$ are collectively referred to as current compensation circuits 206.

The output circuits 208 are coupled in parallel between a differential input 202 and a differential output (Txp, Txn). The differential input 202 includes N differential signals output by the pre-driver 115. Each differential signal includes a true signal, Inp, and a complement signal, Inn. Thus, the differential input 202 includes signals $Inp_1$ through $Inp_N$ and signals $Inn_1$ through $Inn_N$.

The output circuits 208 are coupled to common nodes $V_{refp}$ and $V_{refn}$. Each of the output circuits 208 includes transistors $M_{p1}$, $M_{p2}$, $M_{n1}$, and $M_{n2}$. Each of the output circuits 208 also includes resistors $R_p$ and $R_n$. The transistors $M_{p1}$ and $M_{n1}$ comprise p-channel field effect transistors (FETs), such as P-type metal-oxide semiconductor FETs (MOSFETs) (also referred to as PMOS transistors). The transistors $M_{p2}$ and $M_{n2}$ comprise n-channel FETs, such as N-type MOSFETs (also referred to as NMOS transistors). For purposes of clarity, only the output circuit $208_1$ is shown in detail. However, each of the output circuits $208_2$ through $208_N$ are configured identically with the output circuit $208_1$.

Sources of the transistors $M_{p1}$ and $M_{n1}$ are coupled to the common node $V_{refp}$. Drains of the transistors $M_{p1}$ and $M_{n1}$ are coupled to drains of the transistors $M_{p2}$ and $M_{n2}$, respectively. Sources of the transistors $M_{p2}$ and $M_{n2}$ are coupled to the common node $V_{refn}$. Gates of the transistors $M_{p1}$ and $M_{p2}$ are coupled together and are coupled to receive a signal Inp of one of the input differential signals. Gates of the transistors $M_{n1}$ and $M_{n2}$ are coupled together and are coupled to receive a signal Inn of one of the input differential signals. A first terminal of the resistor $R_p$ is coupled to the drains of the transistors $M_{p1}$ and $M_{p2}$, and a second terminal of the resistor $R_p$ is coupled to the node Txp of the differential output. A first terminal of the resistor $R_n$ is coupled to the drains of the transistors $M_{n1}$ and $M_{n2}$, and a second terminal of the resistor $R_n$ is coupled to the node Txn of the differential output. The transistors $M_{p1}$ and $M_{p2}$ form a first inverter ($M_p$), and the transistors $M_{n1}$ and $M_{n2}$ form a second inverter ($M_n$). A series combination of the pair of inverters ($M_p$, $M_n$) and the pair of resistors $R_p$ and $R_n$ is coupled between the differential input 202 and the differential output (Txp, Txn). The source terminals of the inverters are coupled between the nodes $V_{refp}$ and $V_{refn}$.

The voltage regulator $210_1$ includes an operational amplifier $A_{vrefp}$ and a transistor $M_{vrefp}$. The transistor $M_{vrefp}$ is man n-channel FET, such as an N-type MOSFET. A non-inverting input terminal of the operational amplifier $A_{vrefp}$ is coupled to a first reference voltage source ($V_{ref1}$). An inverting input of the operational amplifier $A_{vrefp}$ is coupled to the node $V_{refp}$. A drain of the transistor $M_{vrefp}$ is coupled to a supply voltage source ($V_{sup}$). A source of the transistor $M_{vrefp}$ is coupled to the node $V_{refp}$. A gate of the transistor $M_{vrefp}$ is coupled to an output of the operational amplifier $A_{vrefp}$.

The voltage regulator $210_2$ includes an operational amplifier $A_{vrefn}$ and a transistor $M_{vrefn}$. The transistor $M_{vrefn}$ is man n-channel FET, such as an N-type MOSFET. A non-inverting input terminal of the operational amplifier $A_{vrefn}$ is coupled to a second reference voltage source ($V_{ref2}$). An inverting input of the operational amplifier $A_{vrefn}$ is coupled to the node $V_{refn}$. A source of the transistor $M_{vrefn}$ is coupled to a ground voltage source. A drain of the transistor $M_{vrefn}$ is coupled to the node $V_{refn}$. A gate of the transistor $M_{vrefn}$ is coupled to an output of the operational amplifier $A_{vrefn}$.

The current compensation circuits 206 are coupled in parallel between the nodes $V_{refp}$ and $V_{refn}$. Each of the current compensation circuits 206 includes transistors $M_1$, $M_2$, and $M_3$. The transistor $M_1$ is a p-channel FET, such as a P-type MOSFET. The transistors $M_2$ and $M_3$ are n-channel FETs, such as an N-type MOSFET. For purposes of clarity, only the current compensation circuit $206_1$ is shown in detail. However, each of the current compensation circuits $206_2$ through $206_M$ are configured identically with the current compensation circuit $206_1$.

A source of the transistor $M_1$ is coupled to the node $V_{refp}$. A drain of the transistor $M_1$ is coupled to a drain of the transistor $M_2$. A source of the transistor $M_2$ is coupled to a drain of the transistor $M_3$. A source of the transistor $M_3$ is coupled to the node $V_{refn}$. A gate of the transistor $M_2$ in each of the current compensation circuits 206 is coupled to a bias voltage source $V_1$. A gate of the transistor $M_3$ in each of the current compensation circuits 206 is coupled to a bias voltage source $V_2$. A gate of the transistor $M_1$ is coupled to receive an enable signal of an enable input 204. The enable input 204 includes M enable signals $EN_1$ through $EN_M$ coupled to the M current compensation circuits 206, respectively.

The output driver 118 further includes capacitors $C_{vrefp}$ and $C_{vrefn}$. The capacitor $C_{vrefp}$ is coupled between the node $V_{refp}$ and electrical ground. The capacitor $C_{vrefn}$ is coupled between the node $V_{refn}$ and electrical ground.

The differential output (Txp, Txn) is coupled to a pair of transmission lines $212_p$ and $212_n$ (collectively transmission lines 212). The transmission lines 212 drive a load resistance $R_L$. The transmission lines 212 and the load resistance $R_L$ are not part of the output driver 118. Rather, the transmission lines 212 are part of the transmission medium 160 and the load resistance $R_L$ is part of the receiver 126.

In operation, each output circuit 208 includes a pair of inverters driven by complementary input (a differential signal of the differential input 202). Each differential signal of the differential input 202 can be one of a main-cursor signal, a post-cursor signal, or a pre-cursor signal. As discussed above, the pre-driver 115 controls the number of output circuits 208 receiving each of the main-cursor, post-cursor, and pre-cursor signals. For example, the output circuits can receive all main-cursor signals, some main-cursor signals and some pre-cursor signals, some main-cursor signals and some post-cursor signals, or some main-cursor signals, some post-cursor signals, and some pre-cursor signals. Mixing post/pre-cursor signals with the main-cursor signals is used to implement emphasis and de-emphasis equalization in the transmitter 112.

The voltage regulators 210 set the swing of the output driver 118. The differential peak-to-peak swing is $V_{refp}$-$V_{refn}$. In an example, the voltage regulator $210_2$ can include a switch 214 configured to short the drain of the transistor $M_{vrefn}$ to electrical ground. This allows the voltage regulator $210_2$ to be disabled in one mode (high-swing mode) and enabled in another mode (low swing mode). Zero or more of the current compensation circuits 206 are selectively enabled using the enable input 204 to draw dummy current from the voltage regulator 210 to improve return loss, as discussed further below. A control signal for the switch 214, and the enable input to the current compensation circuits 206, can be generated by the control logic 150.

With the dual regulators $210_1$ and $210_2$ in the output driver 118, the swing and common-mode can be set independently. For example, the common-mode can be fixed at 0.45 V. Table 1 below illustrates characteristics of the high-swing mode and the low-swing mode for both dual regulators and a single regulator.

TABLE 1

| Regulator Mode | Swing | $V_{refp}$ | $V_{refn}$ | Common-mode |
|---|---|---|---|---|
| Dual | 0.6 V | 0.75 V | 0.15 V | 0.45 V |
| Dual | 0.9 V | 0.9 V | 0 V | 0.45 V |
| Single | 0.6 V | 0.6 V | 0 V | 0.3 V |
| Single | 0.9 V | 0.9 V | 0 V | 0.45 V |

As shown in Table 1, when both regulators $210_1$ and $210_2$ are enabled, the common-mode is the target 0.45 V for the low-swing mode (e.g., 0.6 V). If only the regulator $210_1$ is enabled, the common mode is lower than the target 0.45 V (e.g., 0.3 V) for the low-swing mode. Use of dual regulators allows for a fixed common mode in both low-and high-swing modes. The values in Table 1 are exemplary and the output driver 118 can be configured with other common-mode voltages, other high-swing voltages, and other-low-swing voltages.

In the output driver 118, equalization can be implemented by driving a different number of the output circuits 208 with different main/pre/post cursor signals. With the dual-regulator approach, the swing is changed by adjusting the regulator voltage. Thus, equalization control is independent of the swing control. This allows for high FIR resolution even in low-swing mode.

For a voltage-mode driver, the current drawn by the output circuits 208 can be calculated using the following relationship: Id=(differential swing)/(external differential resistance+internal differential resistance). In an example, each transmission line $212_p$ and $212_n$ has a characteristic impedance $Z_0$ of 50 ohms (external differential resistance=100 ohms). Ideally, the output driver 118 provides a matching impedance of 50 ohms for each transmission line 212 (e.g., internal differential resistance=100 ohms). If the desired swing is 0.9 V, then the current drawn by the output circuits 208 is approximately 4.5 mA. The actual current consumption may be higher to account for transient switching crowbar current.

For the above equation, it is noted that the current drawn by the output circuits 208 changes with the output swing. For lower swing, less current is drawn by the output circuits 208 from the voltage regulator $210_1$. The output impedance of the voltage regulator $210_1$ increases as less current is drawn from the voltage regulator $210_1$. Notably, the output impedance of the voltage regulator $210_1$ is the output resistance of the transistor $M_{vrefp}$ (gm) divided by (1+loop gain). When the voltage regulator $210_1$ supplies low current, the operational amplifier $A_{vrefp}$ provides less loop gain, thereby increasing the output impedance of the voltage regulator $210_1$. The output circuits 208 see an effective impedance of the capacitor $C_{vrefp}$ in parallel with the output impedance of the voltage regulator $210_1$. For mid- to low-frequencies (e.g., 100 MHz), the impedance of the capacitor $C_{vrefp}$ is high and thus the output impedance of the voltage regulator $210_1$ is not negligible. Thus, the decreased output impedance of the voltage regulator $210_1$ due to low current draw by the output circuits 208 degrades the return loss of the output driver 118.

The current compensation circuits 206 are selectively enabled to mitigate the increase in return loss by drawing a constant dummy current in parallel with the output circuits 208. Thus, at higher swing settings, less or none of the current compensation circuits 206 can be enabled, as sufficient current is drawn from the voltage regulator $210_1$. At lower swing settings, more of the current compensation circuits 206 can be enabled, which ensures that sufficient current is drawn from the voltage regulator $210_1$ to maintain loop gain and low output impedance.

Figure 3A:
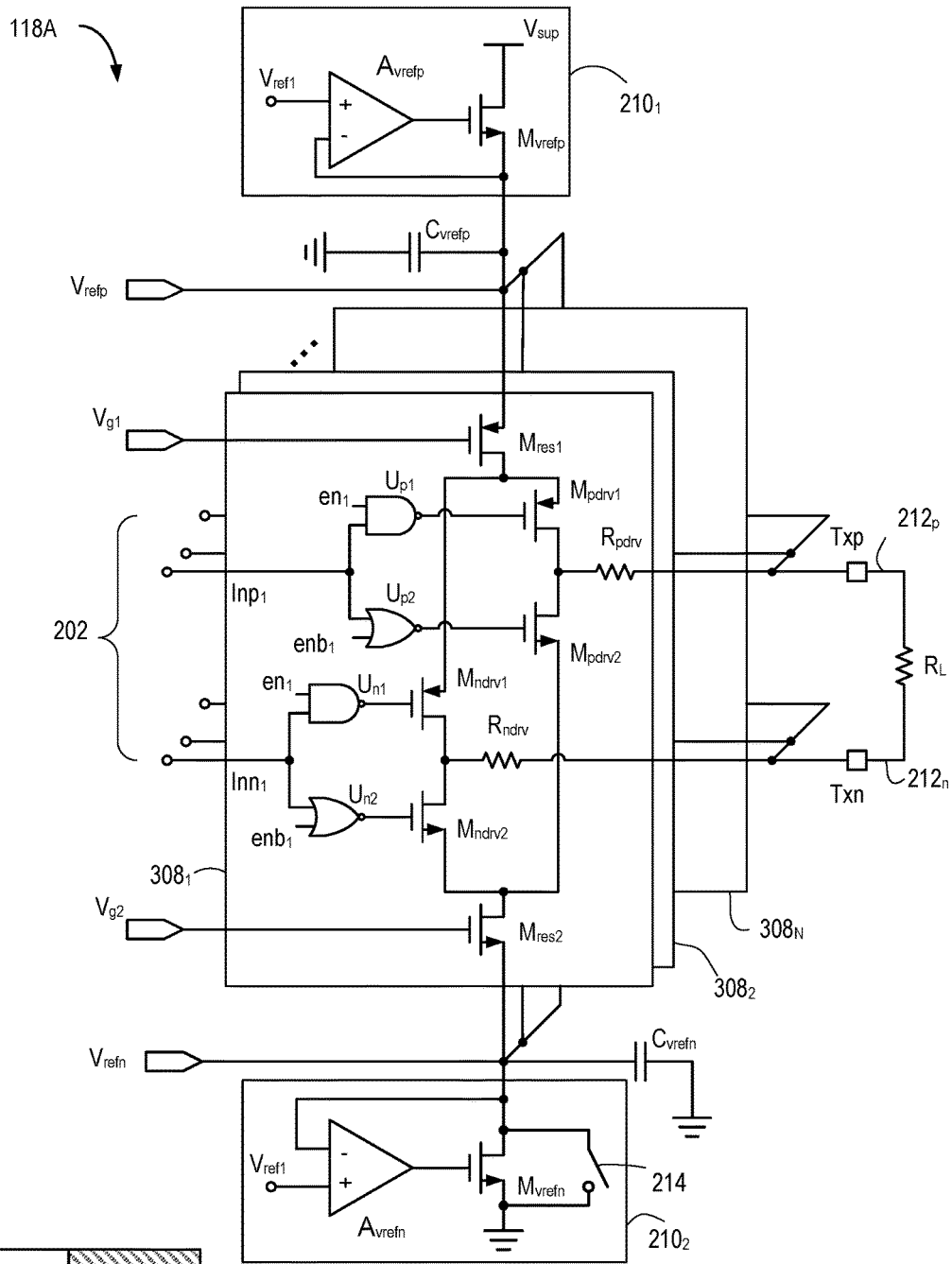
FIGS. 3A-3B depict a schematic diagram of an output driver according to another example.
Figure 3B:
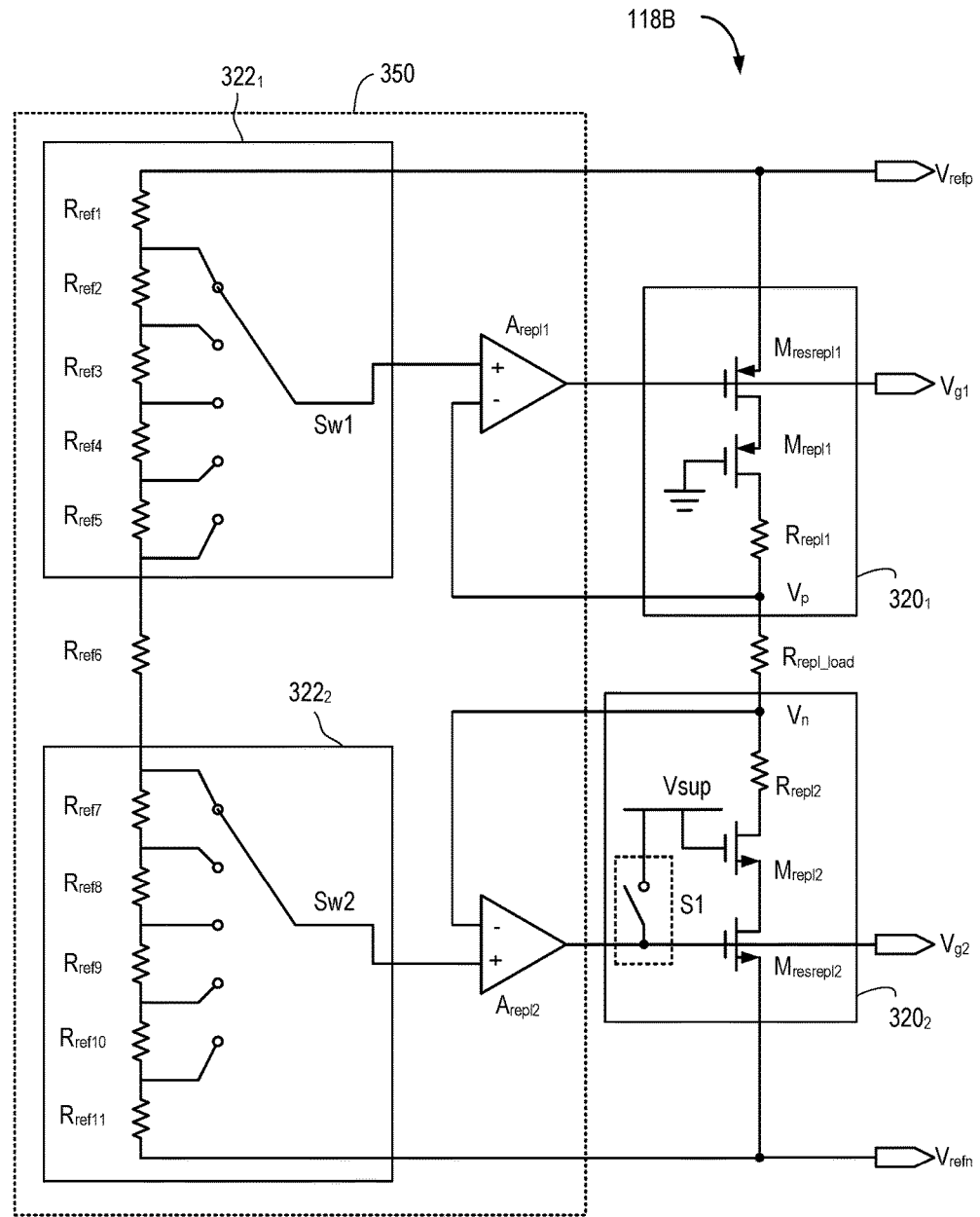

FIGS. 3A-3B depict a schematic diagram of the output driver 118 according to another example. FIG. 3A shows a portion 118A of the output driver 118, and FIG. 3B shows a portion 118B of the output driver 118. Elements in FIGS. 3A and 3B that are the same or similar to those of FIG. 2 are designated with identical reference numerals and are described above. The output driver 118 includes output circuits $308_1$ through $308_N$ (where N is an integer greater than one), the voltage regulators $210_1$ and $210_2$, replica circuits $320_1$ and $320_2$, and a control circuit 350 comprising operational amplifiers $A_{repI1}$, $A_{repI2}$, and resistors $R_{refl1}$ through $R_{refl1}$. The output circuits $308_1$ through $308_N$ are collectively referred to as output circuits 308, and the replica circuits $320_1$ and $320_2$ are collectively referred to as replica circuits 320. In some examples, the output driver shown in FIGS. 3A and 3B can also include the current compensation circuits 206 described above. For purposes of clarity, the current compensation circuits 206 are omitted from FIGS. 3A and 3B.

As shown in the portion 118A of the output driver 118 in FIG. 3A, the output circuits 308 are coupled in parallel between the differential input 202 and the differential output (Txp, Txn). The output circuits 308 are coupled to the common nodes $V_{refp}$ and $V_{refn}$. Each of the output circuits 308 includes transistors $M_{pdrv1}$, $M_{pdrv2}$, $M_{ndrv1}$, $M_{ndrv2}$, $M_{res1}$, and $M_{res2}$. Each of the output circuits 208 also includes resistors $R_{pdrv}$ and $R_{ndrv}$, and enable circuit Up formed by NAND gate $U_{p1}$ and $U_{p2}$, and an enable circuit Un formed by $U_{n1}$ and $U_{n2}$. The transistors $M_{pdrv1}$ and $M_{ndrv1}$ comprise p-channel FETs, such as P-type MOSFETs. The transistors $M_{pdrv2}$ and $M_{ndrv2}$ comprise n-channel FETs, such as N-type MOSFETs. Sources of the transistors $M_{pdrv1}$ and $M_{ndrv1}$ are coupled to a drain of the transistor $M_{res1}$. Drains of the transistors $M_{pdrv1}$ and $M_{ndrv1}$ are coupled to drains of the transistors $M_{pdrv2}$ and $M_{ndrv2}$, respectively. Sources of the transistors $M_{pdrv2}$ and $M_{ndrv2}$ are coupled to a drain of the transistor $M_{res2}$.

Gates of the transistors $M_{pdrv1}$ and $M_{pdrv2}$ are coupled to outputs of the NAND gate $U_{p1}$ and the NOR gate $U_{p2}$, respectively. In another example, the NAND gate $U_{p1}$ and the NOR gate $U_{p2}$ are replaced by a single inverter having an output coupled to the gates of the transistors $M_{pdrv1}$ and $M_{pdrv2}$. First input terminals of the NAND gate $U_{p1}$ and the NOR gate $U_{p2}$ are coupled together, and are coupled to receive one end of a differential input signal (Inp). Second inputs of the NAND gate $U_{p1}$ and the NOR gate $U_{p2}$ are coupled to a true enable signal en and a complement enable signal enb. Gates of the transistors $M_{ndrv1}$ and $M_{ndrv2}$ are coupled to outputs of the NAND gate $U_{n1}$ and the NOR gate $U_{n2}$, respectively. First input terminals of the NAND gate $U_{n1}$ and the NOR gate $U_{n2}$ are coupled together, and are coupled to receive the other end of the differential input signal (Inn). Second inputs of the NAND gate $U_{n1}$ and the NOR gate $U_{n2}$ are coupled to the true enable signal en and the complement enable signal enb. The true enable signal en and the complement enable signal enb are signals of a true enable input and a complement enable input, respectively. The true enable input includes N true enable signals $en_1$ through $en_N$ respectively coupled to the N output circuits 308, and the complement enable input includes N complement enable signals $enb_1$ through $enb_N$ respectively coupled to the N output circuits 308.

A source of the transistor $M_{res1}$ is coupled to the common node $V_{refp}$. A source of the transistor $M_{res2}$ is coupled to the common node $V_{refn}$. A gate of the transistor $M_{res1}$ is coupled to an output of the operational amplifier $A_{repI1}$ (designated node $V_{g1}$). A gate of the transistor $M_{res2}$ is coupled to an output of the operational amplifier $A_{repI2}$ (designated node $V_{g2}$).

One terminal of the resistor $R_{pdrv}$ is coupled to the drains of the transistors $M_{pdrv1}$ and $M_{pdrv2}$, and another terminal of the resistor $R_{pdrv}$ is coupled to the node Txp of the differential output. One terminal of the resistor $R_{ndrv}$ is coupled to the drains of the transistors $M_{ndrv1}$ and $M_{ndrv2}$, and another terminal of the resistor $R_{ndrv}$ is coupled to the node Txn of the differential output. The transistors $M_{pdrv1}$ and $M_{pdrv2}$ form a first inverter ($M_{pdrv}$), and the transistors $M_{ndrv1}$ and $M_{ndrv2}$ form a second inverter ($M_{ndrv}$). A series combination of the enable circuits ($U_p$, $U_n$), the pair of inverters ($M_{pdrv}$, $M_{ndrv}$) and the pair of resistors $R_{pdrv}$ and $R_{ndrv}$ is coupled between the differential input 202 and the differential output (Txp, Txn). The source terminals of the inverters ($M_{pdrv}$, $M_{ndrv}$) are coupled between the nodes $V_{refp}$ and $V_{refn}$.

As shown in the portion 118B of the output driver 118, the replica output circuit 320₁ includes transistors $M_{resrepI1}$ and $M_{repI1}$ and a resistor $R_{repI1}$. The transistors $M_{resrepI1}$ and $M_{repI1}$ are each a p-channel FET, such as a P-type MOSFET. A source of the transistor $M_{resrepI1}$ is coupled to the common node $V_{refp}$. A drain of the transistor $M_{resrepI1}$ is coupled to a source of the transistor $M_{repI1}$. A drain of the transistor $M_{repI1}$ is coupled to one terminal of the resistor $R_{repI1}$. Another terminal of the resistor $R_{repI1}$ is coupled to one terminal of a resistor $R_{repl\_load}$ at a node $V_p$. A gate of the transistor $M_{resrepI1}$ is coupled to the output of the operational amplifier $A_{repI1}$. A gate of the transistor $M_{rep1}$ is coupled to a ground source.

The replica output circuit 320₂ includes transistors $M_{resrepI2}$ and $M_{repI2}$ and a resistor $R_{repI2}$. The transistors $M_{resrepI2}$ and $M_{repI2}$ are each an n-channel FET, such as a N-type MOSFET. A source of the transistor $M_{resrepI2}$ is coupled to the common node $V_{refn}$. A drain of the transistor $M_{resrepI2}$ is coupled to a source of the transistor $M_{repI2}$. A drain of the transistor $M_{repI2}$ is coupled to one terminal of the resistor $R_{repI2}$. Another terminal of the resistor $R_{repI2}$ is coupled to a second terminal of a resistor $R_{repl\_load}$ at a node $V_n$. A gate of the transistor $M_{resrepI2}$ is coupled to the output of the operational amplifier $A_{repI2}$. A gate of the transistor $M_{rep2}$ is coupled to a supply source (Vsup). The replica output circuit 320₂ also includes a startup circuit S1. The startup circuit S1 comprises a switch coupled between the output of the operational amplifier $A_{repI2}$ and the supply source Vsup.

An inverting input of the operational amplifier $A_{repI1}$ is coupled between the resistor $R_{repI1}$ and the resistor $R_{repl\_load}$. A non-inverting input of the operational amplifier $A_{repI1}$ is coupled to a switched resistor network 322₁. The switched resistor network 322₁ comprises the resistors $R_{ref1}$ through $R_{ref5}$ and a switch Sw1. The resistors $R_{ref1}$ through $R_{ref5}$ are coupled in series between the node $V_{refp}$ and the resistor $R_{ref6}$. The switched resistor network 322₁ includes a plurality of taps (e.g., 5 taps in the example). The switch Sw1 is controllable to couple the non-inverting input of the operational amplifier $A_{repI1}$ to one of the taps.

An inverting input of the operational amplifier $A_{repI2}$ is coupled between the resistor $R_{repI2}$ and the resistor $R_{repl\_load}$. A non-inverting input of the operational amplifier $A_{repI2}$ is coupled to a switched resistor network 322₂. The switched resistor network 322₂ comprises the resistors $R_{ref7}$ through $R_{ref11}$ and a switch Sw2. The resistors $R_{ref7}$ through $R_{ref11}$ are coupled in series between the node $V_{refn}$ and the resistor $R_{ref6}$. The switched resistor network 322₂ includes a plurality of taps (e.g., 5 taps in the example). The switch Sw2 is controllable to couple the non-inverting input of the operational amplifier $A_{repI2}$ to one of the taps.

One example technique for impedance control is to provide a pair of programmable resistors stacked in series with all output slices of the driver array. The intent is to adjust the programmable resistors to compensate for variations in the output slices. However, as the programmable resistors are shared by all of the output slices, the differential impedance will deviate from the desired 100 ohms when some output slices are driven in the opposite direction. Another example technique for impedance control is to configure the output slices of the driver array to be selectively enabled/disabled. However, such a technique alone does not compensate for the difference in process variations of PMOS and NMOS transistors, e.g., when PMOS is at fast corner while NMOS is at slow corner and vice versa.

In an example, the output driver 118 provides for impedance control that addresses these problems. Turning on/off output circuits 308 is used to only compensate for on-chip resistor variations. To compensate for NMOS/PMOS variations, each output circuit 308 includes a pair of stacked programmable resistors (described below). The impedance of the stacked programmable resistors is controlled by two impedance control loops.

In operation, the output circuits 308 can be selectively enabled on or off through the enable input. The enable input can be provided by the control logic 150. If enabled, an output circuit 308 contributes to the differential output (Txp, Txn). If disabled, the output circuit 308 does not contribute to the differential output (Txp, Txn) (high impedance state). Turning output circuits 308 on/off provides for coarse impedance control to compensate for variation in the on-chip resistors $R_{pdrv}$ and $R_{ndrv}$. The transistors $M_{res1}$ and $M_{res2}$ are driven to operate in the triode region to provide programmable resistors controllable through $V_{g1}$ and $V_{g2}$, respectively. The transistors $M_{res1}$ and $M_{res2}$ are controlled to compensate for variation in the transistors $M_{pdrv1}$, $M_{pdrv2}$, $M_{ndrv1}$, and $M_{ndrv2}$. The resistance provided by the transistors $M_{res1}$ and $M_{res2}$ is controlled by adjusting their respective gate-to-source voltages using feedback control loops. A feedback control loop that controls the transistor $M_{res1}$ comprises the replica 320₁ and the operational amplifier $A_{repI1}$. A feedback control loop that controls the transistor $M_{res2}$ comprises the replica 320₂ and the operational amplifier $A_{repI2}$.

The operational amplifier $A_{repI1}$ adjusts the gate-to-source voltage of the transistor $M_{resrepI1}$ such that its impedance is set to a desired value. Notably, the transistor $M_{resrepI1}$ is fabricated to be a replica of the transistor $M_{res1}$. The transistor $M_{repI1}$ is fabricated to be a replica of a p-channel FET in the output circuits 308 (e.g., the characteristics for each of $M_{pdrv1}$, $M_{pdrv2}$, and $M_{repI1}$ are the same or substantially similar). The resistor $R_{repI1}$ is fabricated to be a replica of an on-chip resistor in the output circuits 308 (e.g., the characteristics for each of $R_{pdrv}$, $R_{ndrv}$, and $R_{repI1}$ are the same or substantially similar). Each output circuit 308 (if enabled) includes an internal impedance in series with one of the transmission lines 212 formed by a series combination of $M_{res1}$, one p-channel FET (i.e., $M_{pdrv1}$ or $M_{ndrv1}$), and one resistor ($R_{pdrv}$ or $R_{ndrv}$). The replica 320₁ replicates this internal impedance. The desired voltage at node $V_p$ is selected at the non-inverting input of the operational amplifier $A_{repI1}$ and the operational amplifier $A_{repI1}$ drives the node $V_p$ to that voltage by controlling the impedance of the transistor $M_{resrepI1}$. The operational amplifier $A_{repI1}$ provides the same control voltage to the gate of the transistor $M_{res1}$ in each output circuit 308.

The operational amplifier $A_{repI2}$ adjusts the gate-to-source voltage of the transistor $M_{resrepI2}$ such that its impedance is set to a desired value. The transistor $M_{resrepI2}$ is fabricated to be a replica of the transistor $M_{res2}$. The transistor $M_{repI2}$ is fabricated to be a replica of a n-channel FET in the output circuits 308 (e.g., the characteristics for each of $M_{ndrv1}$, $M_{ndrv2}$, and $M_{repI2}$ are the same or substantially similar). The resistor $R_{repI2}$ is fabricated to be a replica of an on-chip resistor in the output circuits 308 (e.g., the characteristics for each of $R_{pdrv}$, $R_{ndrv}$, and $R_{repI2}$ are the same or substantially similar). Each output circuit 308 (if enabled) includes an internal impedance in series with one of the transmission lines 212 formed by a series combination of $M_{res2}$, one n-channel FET (i.e., $M_{pdrv1}$ or $M_{ndrv1}$), one resistor ($R_{pdrv}$ or $R_{ndrv}$). The replica 320₂ replicates this internal impedance. The desired voltage at node $V_n$ is selected at the non-inverting input of the operational amplifier $A_{repI2}$ and the operational amplifier $A_{repI2}$ drives the node $V_n$ to that voltage by controlling the impedance of the transistor $M_{resrepI2}$.

The operational amplifier $A_{repI2}$ provides the same control voltage to the gate of the transistor in each output circuit 308. $M_{res2}$ By including transistors $M_{res1}$ and $M_{res2}$ in each output circuit 308, the differential output impedance of the output driver 118 can be maintained to match the transmission medium 160 even when the main and pre/post cursor signals switch in the opposite direction. Further, by provide two feedback control loops for separately controlling the resistance provided by the transistors $M_{res1}$ and $M_{res2}$, the output driver 118 can compensate for different NMOS and PMOS process variations.

As shown in FIG. 3B, the two feedback control loops are coupled together through the resistor $R_{repl\_load}$ so that the current through the two loops can be re-used. To ensure both loops start up properly, the startup circuit 51 can be incorporated into the replica circuit $320_2$. The startup circuit 51 can disable one loop initially so that the other loop starts up properly. Alternatively, rather than the startup circuit S1, a common-mode buffer can be used to decouple the two feedback control loops by driving the midpoint of the replica load to a common-mode voltage.

To illustrate the impedance control in more detail, consider an example where the output driver 118 includes N=75 to 85 output circuits 308. Typically, an on-chip resistor can change by ±10% due to process variations. As discussed above, variation in the on-chip resistors $R_{pdrv}$ and $R_{ndrv}$ is compensated for by adjusting the number of enabled output circuits 308 (e.g., between 75 and 85 as shown in the example of Table 2).

TABLE 2

|  | 80 Slices | Each Slice | Each slice with resistor +10% | +10% resistor with 85 slices | Each slice with resistor −10% | −10% resistor with 75 slices |
|---|---|---|---|---|---|---|
| Transistor resistance | 20 ohms | 1600 ohms | 1600 ohms | 18.8 ohms | 1600 ohms | 21.3 ohms |
| On-chip resistance | 30 ohms | 2400 ohms | 2640 ohms | 31.1 ohms | 2160 ohms | 28.8 ohms |
| Total resistance | 50 ohms | 4000 ohms | 4240 ohms | 49.9 ohms | 3760 ohms | 50.2 ohms |

As shown in Table 2, the total output impedance can be maintained at approximately 50 ohms for a given differential output (assuming a 50-ohm characteristic impedance of the transmission line) despite a ±10% variation in on-chip resistance by enabling more or less of the output circuits 308. To calibrate the number of output circuits 308 to be turned on/off, the resistance of the on-chip resistors $R_{pdrv}$ and $R_{ndrv}$ can be sensed with a constant current source (not shown). The control logic 150 can read the output of the sensing operation and then enable/disable the output circuits 308 based on values in a lookup table.

One difference between the replica output circuits 320 and the output circuits 308 is that the load of the replica circuits 320, $R_{repl\_load}$, is implemented with an on-chip resistor, while the actual load for the transmitter, $R_{load}$, is a constant termination at the receiver. To avoid using an external resistor or trimming the on-chip resistor $R_{repl\_load}$, the reference voltages used in the feedback control loops can be adjusted to compensate for variation in the on-chip replica resistor $R_{repl\_load}$. This is achieved by selecting a desired voltage at the non-inverting inputs to the operational amplifiers $A_{repI1}$ and $A_{repI2}$. Note that although each switched resistor network 322 is shown has having five taps for providing five reference voltages, the switched resistor networks 322 can have more or less than five taps.

Figure 4:
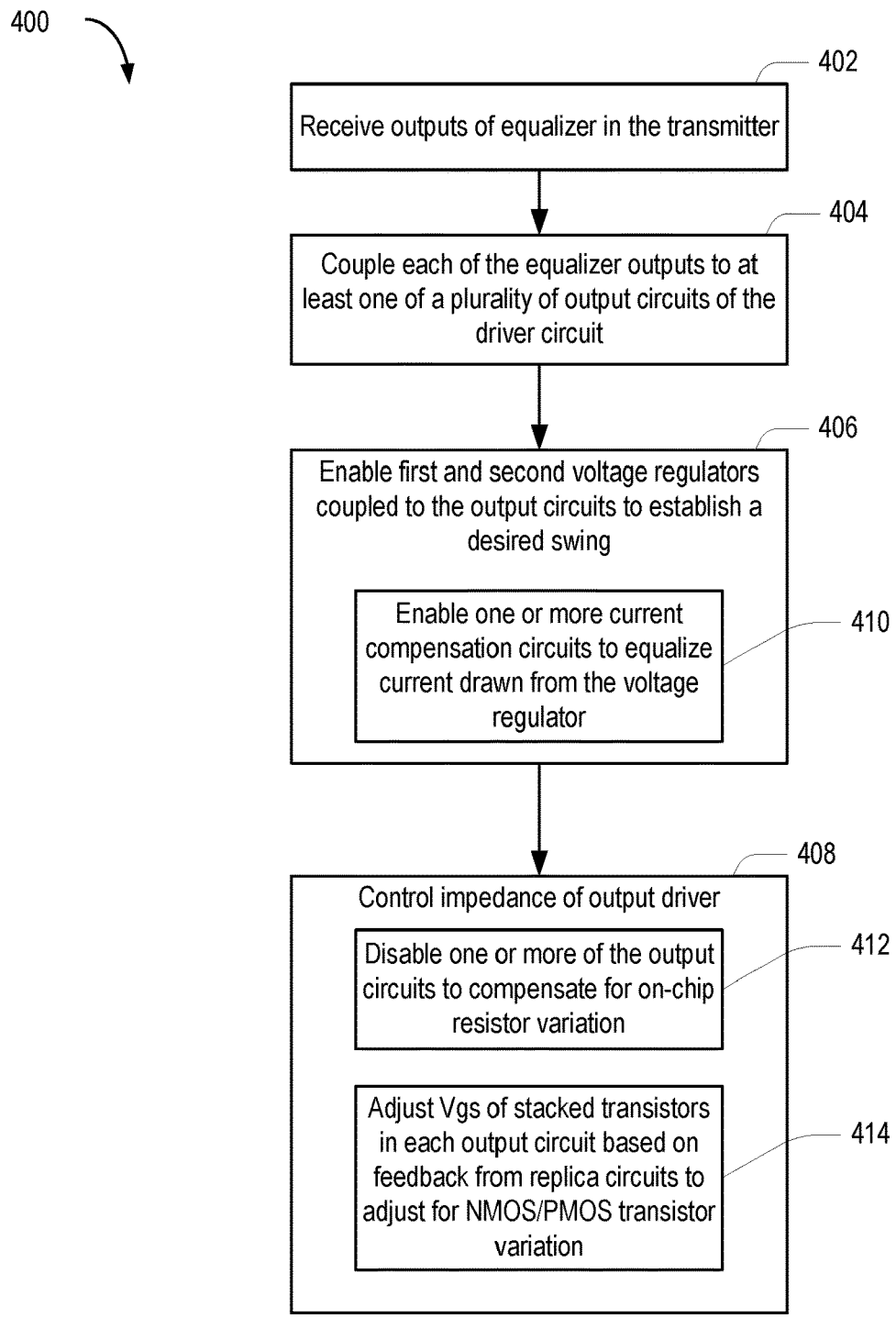
FIG. 4 is a flow diagram depicting a method of controlling a driver circuit in a transmitter according to an example.

FIG. 4 is a flow diagram depicting a method 400 of controlling a driver circuit in a transmitter according to an example. The method 400 can be performed to control the output driver 118 of the transmitter 112. The method 400 begins at step 402, where the pre-driver 115 receives the outputs of an equalizer in the transmitter 112 (e.g., FIR filter 114). At step 404, the pre-driver 115 couples each equalizer output to at least one of a plurality of output circuits in the output driver 118 (e.g., output circuits 208 or 308). Step 404 implements equalizer control independently from swing control and impedance control. The main-, pre-, and post-cursor signals can be coupled to any number of output circuits in the output driver 118 to achieve the desired emphasis or de-emphasis.

At step 406, the control logic 150 enables first and second voltage regulators 210 coupled to the output circuits in the output driver 118 to establish a desired swing. The voltage output from the dual voltage regulators 210 can be set to generate a desired peak-to-peak voltage swing at the output of the output driver 118. In some cases, at step 410, the control logic 150 can optionally enable one or more current compensation circuits 206 to equalize current drawn from the current-supplying voltage regular (e.g., the voltage regulator $210_1$). Step 406 implements output swing control independent of equalizer control and impedance control.

At step 408, the impedance of the output driver is controlled. For example, at step 412, the control logic 150 disables one or more of the output circuits in the output driver 118 to compensate for on-chip resistor variation. This provides for a coarse impedance control. At step 414, feedback control loops in the output driver adjust the gate-to-source voltage of stacked transistors $M_{res1}$ and $M_{res2}$ in each output circuit based on feedback from replica circuits 320 to adjust for NMOS/PMOS transistor variation and provide for fine impedance control. As discussed above, the feedback control loops can independently adjust the impedance of the stacked transistors $M_{res1}$ and $M_{res2}$ to independently compensate for NMOS and PMOS variations.

While the foregoing is directed to specific examples, other and further examples may be devised without departing from the basic scope thereof, and the scope thereof is determined by the claims that follow.

What is claimed is:

1. A driver circuit, comprising:
   a plurality of output circuits coupled in parallel between a differential input and a differential output and having a first common node and a second common node, each of the plurality of output circuits comprising:
      a series combination of a pair of enable circuits, a pair of inverters, and a pair of resistors, coupled between the differential input and the differential output;

a first transistor coupled between the first common node and first source terminals of the pair of inverters; and a second transistor coupled between the second common node and second source terminals of the pair of inverters;

first and second replica output circuits coupled in series between the first and second common nodes; and a control circuit coupled to each of: respective gates of the first and second transistors in each of the plurality of output circuits; and the first and second replica output circuits.

2. The driver circuit of claim 1, further comprising:
a replica load resistor coupled in series between the first and second replica output circuits.

3. The driver circuit of claim 2, wherein:
the first replica output circuit comprises a first replica transistor, a second replica transistor, and a first replica resistor serially connected to provide a current path between the first common node and the replica load resistor; and the second replica output circuit comprises a third replica transistor, a fourth replica transistor, and a second replica resistor serially connected to provide a current path between the replica load resistor and the second common node.

4. The driver circuit of claim 3, wherein the control circuit comprises:
a first operational amplifier having a first terminal coupled to a first switched resistor network, a second terminal coupled to a node between the first replica resistor and the replica load resistor, and an output terminal coupled to each of: a gate of the first replica transistor; and gate of the first transistor in each of the plurality of output circuits; and a second operational amplifier having a first terminal coupled to a second switched resistor network, a second terminal coupled to a node between the second replica resistor and the replica load resistor, and an output terminal coupled to each of: a gate of the fourth replica transistor; and gate of the second transistor in each of the plurality of output circuits.

5. The driver circuit of claim 4, wherein the first switched resistor network is coupled between the first common node and a reference resistor, and wherein the second switched resistor network is coupled between the reference resistor and the second common node.

6. The driver circuit of claim 5, wherein the first switched resistor network comprises a first plurality of taps and a first switch coupled between the first plurality of taps and the first terminal of the first operational amplifier, and wherein the second switched resistor network comprises a second plurality of taps and a second switch coupled between the second plurality of taps and the first terminal of the second operational amplifier.

7. The driver circuit of claim 4, wherein the second replica output circuit further comprises:
a startup circuit coupled to the output terminal of the second operational amplifier.

8. The driver circuit of claim 1, wherein the pair of enable circuits in each of the plurality of output circuits each comprises a NAND gate and a NOR gate.

9. The driver circuit of claim 1, further comprising:
a first voltage regulator having an output coupled to the first common node of the plurality of output circuits; and a second voltage regulator having an output coupled to the second common node of the plurality of circuits.

10. The driver circuit of claim 9, further comprising:
a first capacitor coupled between the first common node of the plurality of output circuits and a ground source; and a second capacitor coupled between the second common node of the plurality of output circuits and the ground source.

11. The driver circuit of claim 1, wherein the differential output of the plurality of output circuits is coupled to a pair of transmission lines.

* * * * *